United States Patent
Pahkala et al.

(10) Patent No.: US 11,594,960 B2
(45) Date of Patent: Feb. 28, 2023

(54) CONTROL CIRCUIT FOR ON-TIME GENERATION DURING OUTPUT VOLTAGE SCALING FOR BUCK CONVERTER

(71) Applicant: Texas Instruments Incorporated, Dallas, TX (US)

(72) Inventors: Janne Matias Pahkala, Oulu (FI); Juha Olavi Hauru, Oulu (FI)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 21 days.

(21) Appl. No.: 17/314,205

(22) Filed: May 7, 2021

(65) Prior Publication Data
US 2022/0360169 A1 Nov. 10, 2022

(51) Int. Cl.
*H02M 3/15* (2006.01)
*H02M 3/155* (2006.01)
*H03K 3/037* (2006.01)
*H02M 1/44* (2007.01)
*H02M 1/088* (2006.01)
*G04F 10/00* (2006.01)

(52) U.S. Cl.
CPC .......... *H02M 3/155* (2013.01); *G04F 10/005* (2013.01); *H02M 1/088* (2013.01); *H02M 1/44* (2013.01); *H03K 3/037* (2013.01)

(58) Field of Classification Search
CPC ........ H02M 3/156; H02M 3/158; H02M 1/00; H02M 1/0003; H02M 1/0025
USPC ........................................................ 323/282
See application file for complete search history.

(56) References Cited

U.S. PATENT DOCUMENTS 10,199,937 B1* 2/2019 Hauru ............... H02M 1/14
2015/0280557 A1* 10/2015 Xue .................. H02M 3/156
323/271

FOREIGN PATENT DOCUMENTS

WO WO-2020061080 A1 * 3/2020 ........... G04F 10/005

* cited by examiner

*Primary Examiner* — Quan Tra
(74) *Attorney, Agent, or Firm* — Ray A. King; Frank D. Cimino

(57) ABSTRACT

A controller includes a phase frequency detection circuit which has a first input coupled to receive a reference clock input, a second input coupled to receive a high-side active output, and an output configured to provide a PFD output. The controller includes a control loop filter which has a first input coupled to receive a slew rate input, a second input coupled to receive the PFD output, and an output configured to provide a high-side length output. The controller includes a pulse generation circuit which has a first input coupled to receive the high-side active output, a second input coupled to receive the high-side length output, and an output configured to provide a fine pulse output. The controller includes a latch configured to provide the high-side active output responsive to a comparison output and the fine pulse output.

19 Claims, 2 Drawing Sheets

_(12) United States Patent_ — omitted

CONTROL CIRCUIT FOR ON-TIME GENERATION DURING OUTPUT VOLTAGE SCALING FOR BUCK CONVERTER

TECHNICAL FIELD

This description relates generally to switch mode regulators.

BACKGROUND

Switch mode regulators such as buck converters are generally designed to provide a wide range of output voltage. A buck converter may include high-side and low-side field effect transistors (FETs) which are coupled at a switching terminal in a bridge configuration. An inductor is coupled between the switching terminal and an output terminal, and a capacitor is coupled between the output terminal and a ground terminal.

If the output voltage of the buck converter is scaled down, the slew rate of the current in the inductor changes. When the slew rate of the inductor current changes, the on-time period of the high-side FET needs to change to regulate the converter at a desired switching frequency. Some buck converters include a control loop which adjusts the on-time period of the high-side FET. If the bandwidth of the control loop is slow, the buck converter will be unable to quickly adjust the on-time period of the high-side FET, which may result in increased ripple current in the inductor and thus violate settling time requirement. Conversely, if the bandwidth of the loop is fast, the control loop may become unstable if the slew rate of the output voltage scaling is slow.

SUMMARY

In one aspect, a controller for a DC-DC converter includes a phase frequency detection circuit which has a first input coupled to receive a reference clock input, a second input coupled to receive a high-side active output, and an output configured to provide a phase frequency detection (PFD) output. The controller includes a control loop filter which has a first input coupled to receive a slew rate input, a second input coupled to receive the PFD output, and an output configured to provide a high-side length output. The controller includes a pulse generation circuit which has a first input coupled to receive the high-side active output, a second output coupled to receive the high-side length output, a third input coupled to receive a fine select output, and an output configured to provide a fine pulse output. The controller includes a latch which has a first input coupled to receive a comparison output, a second input coupled to receive the fine pulse output, and an output configured to provide the high-side active output.

In an additional aspect, the phase frequency detection circuit includes a phase frequency detector (PFD) which has a first input coupled to receive the reference clock input, a second input coupled to receive the high-side active output, a first output configured to provide an increment (UP) output, and a second output configured to provide a decrement (DN) output. The phase frequency detection circuit includes a time to digital (TTD) converter which has a first input coupled to receive the UP output, a second input coupled receive the DN output, a first output configured to provide the PFD output, and a second output configured to the provide the fine select output.

In an additional aspect, the pulse generation circuit includes a coarse pulse generator which has a first input coupled to receive the high-side length output, a second input coupled to receive the high-side active output, and an output configured to provide a coarse pulse output. The pulse generation circuit includes a fine pulse generator which has a first input coupled to receive the coarse pulse output, a second input coupled to receive the fine select output, and an output configured to provide the fine pulse output.

In an additional aspect, the PFD is configured to provide the UP output if the rising edge of the reference clock input occurs before the rising edge of the high-side active input and to provide the DN output if the rising edge of the high-side active output occurs before the rising edge of the reference clock input.

In an additional aspect, the control loop filter includes an integration coefficient controller configured to select an integration coefficient based on the slew rate of an output voltage scaling. The integration coefficient is used to adjust the control loop gain and bandwidth to regulate a switching frequency when the output voltage is scaled.

In an additional aspect, a switch mode regulator includes a high-side transistor coupled between an input voltage terminal and a switching terminal. The high-side transistor has a gate coupled to receive a high-side gate output. The regulator includes a low-side transistor coupled between the switching terminal and a ground terminal. The low-side transistor has a gate coupled to receive a low-side gate output. The switch mode regulator includes an inductor coupled between the switching terminal and an output voltage terminal and includes a capacitor coupled between the output voltage terminal and the ground terminal. The regulator includes a gate drive circuit which has an input coupled to receive a high-side active output, a first output configured to provide the high-side gate output, and a second output configured to provide the low-side gate output.

In an additional aspect, the regulator includes a controller which has a phase frequency detection circuit having a first input coupled to receive a reference clock input, a second input coupled to receive the high-side active output, and an output configured to provide phase frequency detection (PFD) output. The controller includes a control loop filter which has a first input coupled to receive a slew rate input, a second input coupled to receive the PFD output, and an output configured to provide a high-side length output. The controller includes a pulse generation circuit which has a first input coupled to receive the high-side active output, a second input coupled to receive the high-side length output, a third input coupled to receive a fine select output, and an output configured to provide a fine pulse output. The controller includes a latch which has a first input coupled to receive a comparison output, a second input coupled to receive the fine pulse output, and an output configured to provide the high-side active output.

DETAILED DESCRIPTION

Figure 1:
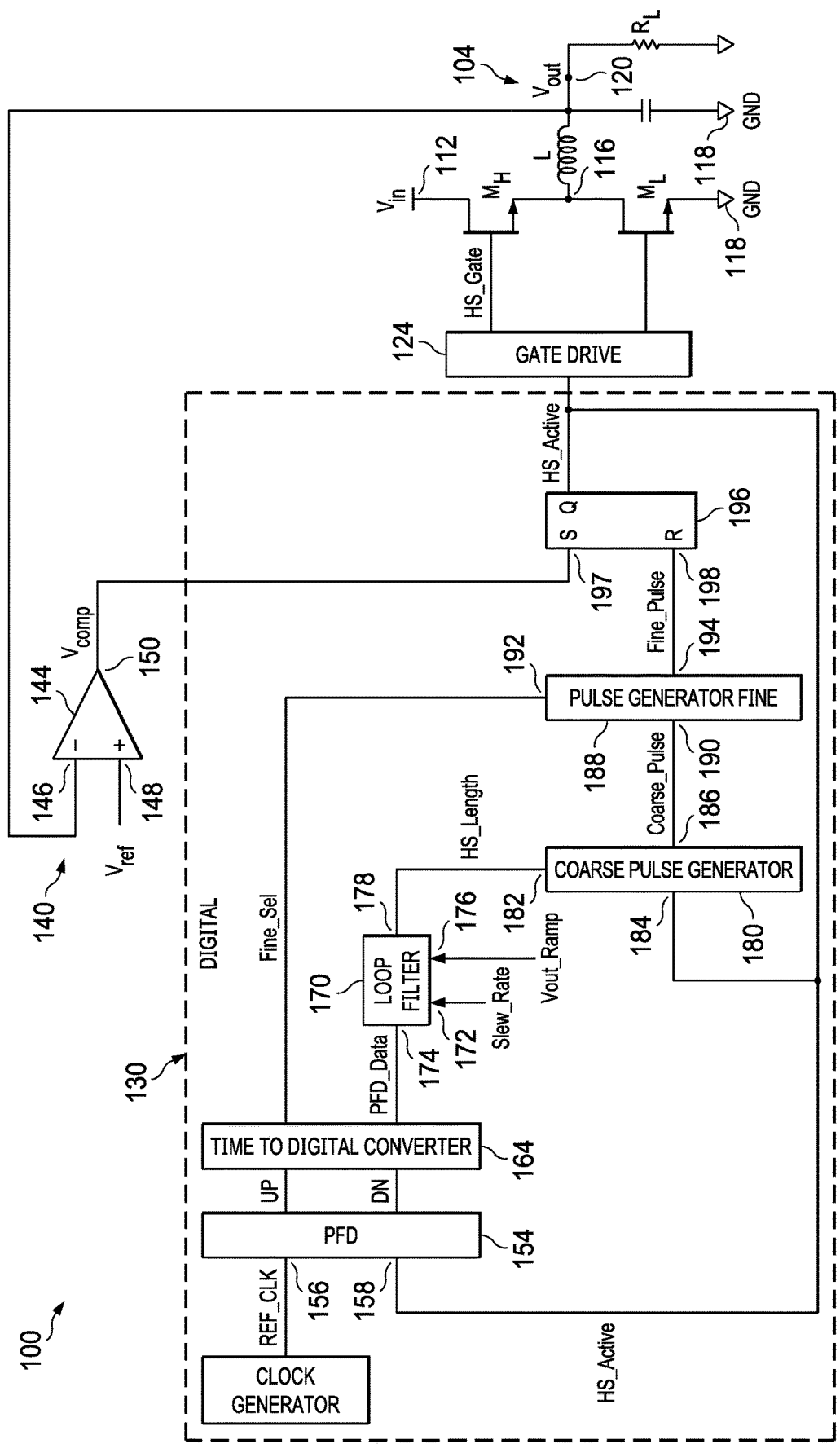
FIG. 1 is a block diagram of a switch mode regulator system of an example embodiment.

FIG. 1 is a block diagram of a switch mode regulator system 100 of an example embodiment. The regulator system 100 includes a DC-DC converter such as a buck converter 104. The buck converter 104 includes: (a) a high-side switch $M_H$ coupled between an input voltage terminal 112 and a switching terminal (i.e., node) 116; and (b) a low-side switch $M_L$ coupled between the switching terminal 116 and a ground terminal 118. The input voltage terminal 112 may be coupled to an input voltage $V_{in}$ and the ground terminal 118 may be coupled to a ground voltage level.

The buck converter 104 comprises an inductor L coupled between the switching terminal 116 and an output terminal 120. A capacitor C is coupled between the output terminal 120 and the ground terminal 118, and a load represented by $R_L$ is coupled between the output terminal 120 and the ground terminal 118. In another example embodiment, the load may be a current source which feeds current back to the buck converter 104.

The system 100 comprises a gate drive circuit 124 which provides a high-side gate signal HS_Gate to turn on/off the high-side switch $M_H$ and provides a low-side gate signal LS_Gate to turn on/off the low-side switch $M_L$ at a high frequency. By varying the ratio of on-time to off-time time of the high-side gate signal HS_Gate, a regulated output voltage $V_{out}$ is provided at the output terminal 120. The ratio of the "on" to "off" time of HS_Gate is known as the duty cycle.

In operation, the high-side switch $M_H$ and the low-side switch $M_L$ are turned on/off in a complementary way. When $M_H$ is on and $M_L$ is off, $V_{in}$ is coupled to the switching terminal 116. When $M_H$ is off and $M_L$ is on, the switching terminal 116 is coupled to the ground terminal 118. The current through the inductor L rises when $M_H$ is on and falls when $M_L$ is on. If the current through the inductor L is higher than the load current, the capacitor C is charged. If the current through the inductor L is less than the load current, the capacitor C is discharged and in this period the capacitor C supplies current to the load $R_L$ to compensate for the current demanded by $R_L$.

In an example embodiment, the regulator system 100, or some parts of the regulator system 100, may be implemented as an integrated circuit (IC) on a semiconductor die or on an IC package.

Figure 2A:
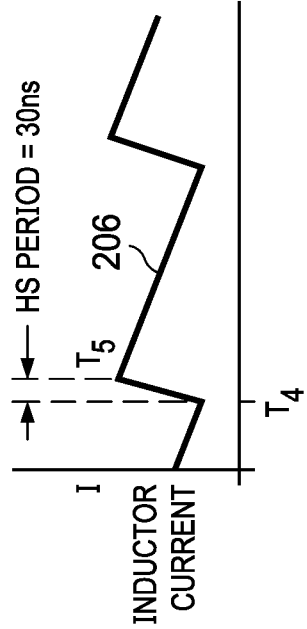
FIGS. 2A-2B illustrate current waveforms of a regulator system of an example embodiment.
Figure 2B:
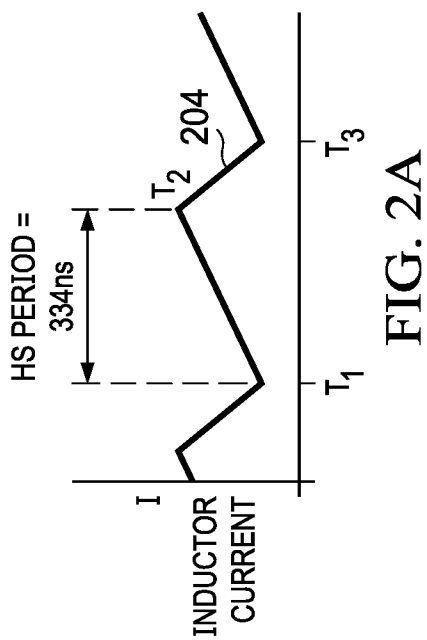

FIGS. 2A-2B illustrate two waveforms of currents as a function of time flowing through the inductor L prior to and after the output voltage $V_{out}$ is scaled. FIG. 2A shows current 204 through the inductor L when the output voltage $V_{out}$ is regulated at 3.3V, and FIG. 2B shows current 206 through the inductor L when the output voltage $V_{out}$ is scaled down to 0.3V. In both scenarios, the system 100 is operated at a switching frequency=2 MHz and Vin=5V.

At time T1, when current 204 (shown in FIG. 2A) is at a valley level (also referred to as a low level), the high-side switch $M_H$ is turned on and is held on until time T2 for 334 ns (i.e., on-time of the high-side switch $M_H$=334 ns). When $M_H$ is on, current 204 rises through the inductor L. At time T2, when current 204 is at a peak level, the high-side switch $M_H$ is turned off, but the low-side switch $M_L$ is turned on and $M_L$ is held on until time T3 for 166 ns. When $M_L$ is on, current 204 falls back to the valley level at time T3.

Consider, for example, at time T4 when current 206 (shown in FIG. 2B) is at a valley level, $V_{out}$ is scaled from 3.3V to 0.3V at a predetermined slew rate (e.g., 10 mv/us). As $V_{out}$ is scaled, the inductor current slew rate changes, which requires a change to the high-side on-time to maintain (i.e., regulate) the switching frequency. In the example of FIG. 2B, the on-time of the high-side switch $M_H$ is reduced to 30 ns.

Because the high-side on-time must be changed (i.e., adapted) during the time period V $T_{out}$ is scaled down to maintain the switching frequency, the system 100 needs to respond timely to adapt the high-side on-time.

The system 100 comprises an on-time generation (OTG) controller 130 coupled to the gate drive circuit 124. The OTG controller 130 synchronizes the system 100 with a reference clock signal REF_CLK by adapting (i.e., varying) the on-time of the high-side switch $M_H$. The system 100 comprises a valley current controller 140 which regulates the output voltage $V_{out}$ at a target level. The OTG controller 130 forms a digital on-time control loop and the valley current controller 140 forms an analog valley current control loop. Together, the digital and the analog loops regulate the output voltage $V_{out}$ at a target level and adapts the phase and the switching frequency of the system 100 to match the phase and the frequency of the reference clock signal REF_CLK. The valley current controller 140 starts the on-time of the high-side switch $M_H$ while the OTG controller 130 ends the on-time of the high-side switch $M_H$ and varies the switching frequency and phase of the system 100 to match the frequency and phase of REF_CLK.

In an example embodiment, the OTG controller 130 selects an integration coefficient which is described below. The integration coefficient is selected based on a desired slew rate of the output voltage scaling. The integration coefficient changes the gain and bandwidth of the OTG control loop, thus changing (i.e., adapting) the speed of the high-side on-time adaptation to maintain the desired frequency during the output voltage scaling. Because the switching frequency of the system 100 can be varied by changing the high-side on-time, the OTG controller 130 is able to adapt the high-side on time to regulate the switching frequency of the system 100 to match the frequency of REF_CLK.

The valley current controller 140 comprises a comparison circuit 144 which has a first input 146 coupled to receive a feedback signal indicative of the output voltage $V_{out}$. The first input 146 may be directly coupled to the output terminal 120 or may be indirectly coupled to $V_{out}$ via a voltage divider (not shown in FIG. 1). The comparison circuit 144 has a second input 148 coupled to receive a reference voltage signal $V_{ref}$. The comparison circuit 144 provides a comparison signal $V_{comp}$ at an output 150 responsive to the difference in amplitude between $V_{out}$ and $V_{ref}$. In an example embodiment, the comparison circuit 144 is implemented with an analog comparator that provides $V_{comp}$ which is a rectangular pulse wave. The reference voltage $V_{ref}$ can be derived from, or otherwise can be based on, one or more user inputs.

The OTG controller 130 comprises a phase frequency detector (PFD) 154 which has a first input 156 coupled to receive a reference clock signal REF_CLK and a second input 158 coupled to receive a high-side active signal HS_Active. The reference clock signal REF_CLK can be obtained from an external clock or a reference clock. The HS_Active signal operates to turn on or otherwise enable the high-side switch $M_H$. The PFD 154 determines a phase difference between a rising edge of REF_CLK and a rising edge of HS_Active and provides an increment (UP) signal if the rising edge of REF_CLK occurs before the rising edge of HS_Active and provides a decrement (DN) signal if the rising edge of HS_Active occurs before the rising edge of REF_CLK. (The terms "signal" and "data" are used interchangeably herein).

The OTG controller 130 comprises a time to digital (TTD) converter 164 which receives the increment (UP) and the decrement (DN) signals. The TTD converter 164 measures the pulse length of the UP signal or the DN signal and translates the pulse length to a digital format. In an example embodiment, the TTD converter 164 provides phase frequency detection data PFD_Data (e.g., 8-bit data [7:0]) and fine select data Fine_Sel (e.g., 5-bit data [7:0]).

The on-time controller 130 comprises a control loop filter 170 which has a first input 172 coupled to receive slew rate data Slew_Rate a second input 174 coupled to receive PFD_data, and a third input 176 coupled to receive an output voltage ramp active signal Vout_Ramp_Active. In an example embodiment, Slew_Rate has a digital format (e.g., 3-bit data) which represents a target or desired slew rate of the output voltage scaling. The slew rate signal Slew_Rate can be determined based on following inputs: (1) initial output voltage; (2) scaled-down output voltage (i.e., target output voltage); and (3) time interval to scale down from the initial output voltage to the scaled-down output voltage. The output voltage ramp active signal Vout_Ramp_Active indicates that the output voltage Your is scaled. The control loop filter 170 provides a high-side length signal HS_Length at an output 178. The high-side length HS_Length controls the high-side period or the time during which the high-side switch $M_H$ is on or otherwise enabled. In an example embodiment, HS_Length has a digital format (e.g., 13-bit data [13:0]).

In an example embodiment, if REF_CLK occurs before HS_Active, the PFD 154 determines that the switching frequency of the system 100 is slower than the frequency of REF_CLK. Therefore, the switching frequency of the system 100 needs to be increased to match the frequency of REF_CLK. Accordingly, the PFD 154 provides the increment (UP) signal and in response the control loop filter 170 reduces the pulse length of HS_Active, which has the effect of increasing the switching frequency.

Conversely, if HS_Active occurs before CLK, the PFD 158 determines that the switching frequency of the system 100 is faster than the frequency of REF_CLK. Therefore, the switching frequency of the system 100 needs to be reduced to match the frequency of REF_CLK. Accordingly, the PFD 154 provides the decrement (DN) signal and in response the loop filter 170 increases the pulse length of HS_Active, which has the effect of reducing the switching frequency.

As explained below, the control loop filter 170 provides the high side length signal HS_length based on PFD_data and an integration coefficient. The integration coefficient is selected based on the desired slew rate Slew_Rate. In an example embodiment, Slew_Rate is represented by 3-bit data. If the slew rate Slew_Rate is high, the control loop filter 170 selects a high integration coefficient value and if the slew rate is low, the control loop filter 170 selects a low integration coefficient value. In an example embodiment, HS_length can be represented as a function of PFD_Data and the integration coefficient.

HS_Length=HS_length_previous+PFD_data*integration coefficient

Thus, by changing the integration coefficient, how much the PFD_data adapts the HS_Length is changed. Table 1 lists slew rates and corresponding integration coefficients of an example embodiment.

TABLE I

| Slew_Rate | Integration Coefficient |
|---|---|
| 33 mV/us | $2^5$ |
| 20 mV/us | $2^4$ |
| <20 mV/us | $2^3$ |

The on-time controller 130 comprises a pulse generation circuit comprising a coarse pulse generator 180 and a fine pulse generator 188. The coarse pulse generator 180 receives HS_Length at a first input 182 and receives HS_Active at a second input 184. In response, the coarse pulse generator 180 provides a coarse pulse signal Coarse_Pulse at an output 186. The fine pulse generator 180 receives the coarse pulse signal Coarse_Pulse at a first input 190 and receives the fine select signal Fine_Sel at a second input 192 and in response provides the fine pulse signal Fine_Pulse at an output 194.

In one aspect, the coarse pulse generator 180 and the fine pulse generator 188 jointly functions as a proportional integration (PI) compensator to compensate HS_length. The coarse pulse generator 180 forms the integration term (I-term) of the PI compensation, and the fine pulse generator 188 forms the proportional term (P-term) of the PI compensation.

In an example embodiment, the coarse pulse generator 180 provides the coarse pulse signal Coarse_Pulse after an adaptive delay (e.g., 2 ns–1200 ns). The coarse pulse generator 180 is triggered responsive to the high side active signal HS_Active and the adaptive delay is applied to the HS_Active commencing at the rising edge of HS_Active. After the delay has elapsed, the coarse pulse generator 180 outputs the coarse pulse signal Coarse_Pulse which triggers the fine pulse generator 188.

The fine pulse generator 188 receives the fine select signal FINE_SEL and applies a fine delay to the coarse pulse signal Coarse_Pulse based on Fine_Sel. The fine delay is controlled by Fine_Sel which is provided to the fine pulse generator 188. In an example embodiment, Fine_Sel is 5-bit data [4:0] which translates to a delay between 1 ns–6 ns. The fine pulse generator 188 provides the fine pulse signal Fine_Pulse.

The OTG controller 130 comprises a latch 196 which has a set input 197 coupled to receive the comparison signal $V_{comp}$ and has a reset input 198 coupled to receive the fine pulse signal Fine_Pulse. The latch 196 provides the high-side active signal HS_Active. In an example embodiment, the latch is an S-R latch which provides HS_Active at a Q output. The HS_Active signal is a pulse width modulated (PWM) signal having a variable pulse length.

The gate drive circuit 124 receives HS_Active, and in response applies the high-side gate signal HS_Gate to turn on/off the high-side switch $M_H$ and applies the low-side gate signal LS_Gate to turn on/off the low-side switch $M_L$. The high-side gate signal HS_Gate and the low-side gate signal LS_Gate are complementary signals. Thus, when HS_Gate is high, LS_Gate is low, and vice versa.

In an example embodiment, Vref, Vout_Ramp_Active and Slew_Rate are provided by a voltage control circuit (not shown in FIG. 1) in response to one or more user inputs.

Figure 3:
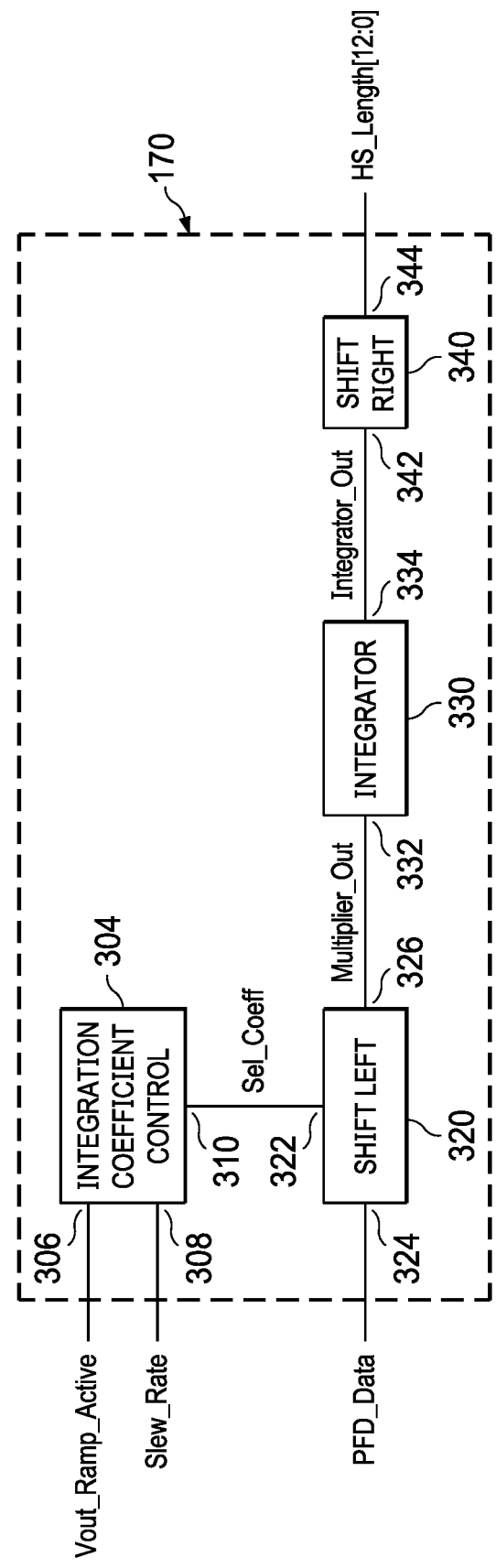
FIG. 3 is a block diagram of a control loop filter of an example embodiment.

FIG. 3 is a detailed block diagram of the control loop filter 170 of an example embodiment. In an example embodiment, the control loop filter 170 may be implemented as an integrated circuit (IC) on a semiconductor die or on an integrated circuit (IC) package.

The control loop filter 170 comprises an integration coefficient control circuit 304 which has a first input 306 coupled to receive the output voltage ramp active signal Vout_Ramp_Active and a second input 308 coupled to receive the slew rate signal Slew_Rate. The integration coefficient control circuit 304 provides an integration coefficient Sel_Coeff at an output 310. In an example embodiment, Sel_Coeff has a digital format (e.g., 3-bit data). The control loop filter 170 includes a first shift register 320 (referred to as a shift left register) which has a first input 322 coupled to receive the integration coefficient Sel_Coeff and has a second input 324 coupled to receive PFD_Data. Depending on Sel_Coeff value, PFD_Data is shifted left with 3, 4 or 5 bits in the first shift register 320. The first shift register 320 provides a multiplier output Multiplier_Out at an output 326. In an example embodiment, Multiplier_Out is 17-bit data [16:0].

The control loop filter 170 comprises an integrator 330 which has an input 332 coupled to receive the multiplier output Multiplier_Out. The integrator 330 integrates Multiplier_Out and provides an integrator output Integrator_Out. In an example embodiment, Integrator_Out is 21-bit data [20:0]. The integrator 330 can, for example, be implemented with an accumulator circuit comprising an adder coupled to a latch (D Flip Flop) and the output of the latch is fed back to the adder. The control loop filter 170 includes a second shift register 340 (referred to as shift right register) which has an input 342 coupled to receive the integrator output Integrator_Out. The second shift register 340 shifts Integrator_Out to the right and provides the high side length signal HS_Length at an output 344. The first shift register 320 (shift left register), the integrator 330 and the second shift register 340 (shift right register) jointly perform the operation HS_Length=HS_length_previous+ PFD_data*integration coefficient.

In an example embodiment, due to left and right shifting by the shift registers 320 and 340, the actual integration coefficients in Table 1 translates to:

$$2^5/2^8=2^{-3}=0.125$$

$$2^4/2^8=2^{-4}=0.0625$$

$$2^3/2^8=2^{-5}=0.03125$$

Consider, as an example, the on-time period of the high-side FET is 78 ns and the rising edge of the reference clock REF_CLK occurs 16 ns after the rising edge of HS_active signal. Thus, the PFD 154 provides a decrement (DN) signal whose pulse length is 16 ns. The TTD converter 164 converts the pulse length to a digital format having 13 bits (12'b0000_0001_0000). The integration coefficient is $(2^{shift\_left})/(2^{shift\_right})$. Thus, HS_Length is computed as follows: HS_Length=HS_length_previous+ PFD_Data*integration coefficient=HS_length_previous+ $16*2^5/2^8$=HS_length_previous+2. The next on-time period of the high-side FET is increasedby 2*(coarse pulse generator LSB). If coarse pulse generator LSB=150 ps, the next on-time period of the high-side FET is 300 ps longer than the previous on-time period of the high-side FET.

In this description, the term "couple" may cover connections, communications, or signal paths that enable a functional relationship consistent with this description. Also, in this description, a device that is configured to perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means ±10 percent of the stated value.

Modifications are possible in the described embodiments, and other embodiments are possible, within the scope of the claims.

What is claimed is:

1. A controller for a DC-DC converter, comprising:
   a phase frequency detection circuit having a detection output and first and second detection inputs, the first detection input coupled to a reference clock terminal, the second detection input coupled to a high-side active terminal, and the phase frequency detection circuit configured to provide a phase frequency detection (PFD) signal at the detection output;
   a control loop filter having a filter output and first and second filter inputs, wherein the first filter input is coupled to a slew rate terminal, the second filter input is coupled to the detection output, and the control loop filter is configured to provide a high-side length signal at the filter output, wherein the control loop filter includes an integration coefficient controller configured to provide an integration coefficient responsive to a slew rate of an output voltage scaling, and wherein a gain and a bandwidth of the control loop filter are adjusted responsive to the integration coefficient;
   a pulse generation circuit having a pulse output and first, second and third pulse inputs, wherein the first pulse input is coupled to a high-side active terminal, the second pulse input is coupled to the filter output, the third pulse input coupled to a fine select terminal, and the pulse generation circuit is configured to provide a fine pulse signal at the pulse output; and a latch having a latch output and first and second latch inputs, wherein the first latch input is coupled to a comparator output, the second latch input is coupled to the pulse output, and the latch output is coupled to the high-side active terminal.

2. The controller of claim 1, wherein the phase frequency detection circuit includes:
a phase frequency detector (PFD) having first and second PFD outputs and first and second PFD inputs, wherein the first PFD input is coupled to the reference clock terminal, the second PFD input is coupled to the latch output, and the PFD is configured to provide an UP signal at the first PFD output, and configured to provide a DN signal at the second PFD output; and
a time to digital (TTD) converter having first and second TTD inputs and first and second TTD outputs, wherein the first TTD input is coupled to the first PFD output, the second TTD input is coupled to the second PFD output, the first TTD output is coupled to the fine select terminal, and the second TTD output is coupled to the second filter input.

3. The controller of claim 1, wherein the pulse generation circuit includes:
a coarse pulse generator having a coarse output and first and second coarse inputs, wherein the first coarse input is coupled to the filter output, the second coarse input is coupled to the high-side active terminal, and the coarse pulse generator is configured to provide a coarse pulse signal at the coarse output; and
a fine pulse generator having a fine output and first and second fine inputs, wherein the first fine input is coupled to the coarse output, the second fine input is coupled to the fine select terminal, and the fine pulse generator is configured to provide the fine pulse signal at the fine output.

4. The controller of claim 2, wherein the PFD provides the UP signal at the first PFD output responsive to a rising edge of a signal at the reference clock terminal occurring before a rising edge of a signal at the high-side active terminal, and provides the DN signal at the second PFD output responsive to the rising edge of the signal at the high-side active terminal occurring before the rising edge of the signal at the reference clock terminal.

5. The controller of claim 1, wherein the comparator output is an output terminal of a comparator having first and second inputs, the first input coupled to a reference voltage terminal, and the second input coupled to an output voltage terminal.

6. A switch mode regulator, comprising:
a gate drive circuit having a gate drive input, a high-side gate output, and a low-side gate output, wherein the gate drive input is coupled to a high-side active terminal;
a high-side transistor coupled between an input voltage terminal and a switching terminal, and having a gate coupled to the high-side gate output;
a low-side transistor coupled between the switching terminal and a ground terminal, and having a gate coupled to the low-side gate output;
an inductor coupled between the switching terminal and an output voltage terminal;
a capacitor coupled between the output voltage terminal and the ground terminal;
a controller comprising:
a phase frequency detection (PFD) circuit having a PFD output and first and second PFD inputs, wherein the first PFD input is coupled to a reference clock terminal, and the second PFD input is coupled to the high-side active terminal;
a control loop filter having a filter output and first and second filter inputs, wherein the first filter input is coupled to a slew rate terminal, and the second filter input is coupled to the PFD output, wherein the control loop filter includes an integration coefficient controller configured to select an integration coefficient responsive to a slew rate of a scaled output voltage, and wherein a gain and a bandwidth of the control loop filter are adjusted responsive to the integration coefficient;
a pulse generation circuit having a pulse output and first, second and third pulse inputs, wherein the first pulse input is coupled to the high-side active terminal, the second pulse input is coupled to the filter output, and the third pulse input is coupled to a fine select terminal; and
a latch having a latch output and first and second latch inputs, wherein the first latch input is coupled to a comparison terminal, the second latch input is coupled to the pulse output, and the latch output coupled to the high-side active terminal.

7. The switch mode regulator of claim 6, further comprising a comparator having a comparator output and first and second comparator inputs, wherein the first comparator input is coupled to a feedback terminal, the second comparator input is coupled to a reference voltage terminal, and the comparator output is coupled to the comparison terminal.

8. The switch mode regulator of claim 7, wherein the feedback terminal is coupled to an output voltage terminal.

9. The switch mode regulator of claim 6, wherein the PFD circuit includes:
a detector having first and second detector inputs, an UP output and a DN output, wherein the first detector input is coupled to the reference clock terminal, and the second detector input is coupled to the high-side active terminal; and
a time to digital (TTD) converter having first and second TTD inputs and first and second TTD outputs, wherein the first TTD input is coupled to the UP output, and the second TTD input is coupled to the DN output, the first TTD output is coupled to the second filter input, and the second TTD output is coupled to the fine select terminal.

10. The switch mode regulator of claim 6, wherein the pulse generation circuit includes:
a coarse pulse generator having a coarse pulse output and first and second coarse pulse inputs, wherein the first coarse pulse input is coupled to the filter output, and the second coarse pulse input is coupled to the high-side active terminal; and
a fine pulse generator having a fine pulse output and first and second fine pulse inputs, wherein the first fine pulse input is coupled to the coarse pulse output, and the second fine pulse input is coupled to the fine select terminal, and the fine pulse output is coupled to the second latch input.

11. The switch mode regulator of claim 6, wherein the PFD is configured to provide an UP signal at the UP output responsive to a rising edge of a signal at the reference clock terminal occurring before a rising edge of a signal at the high-side active terminal, and to provide a DN signal at the DN output responsive to the rising edge of the signal at the high-side active terminal occurring before the rising edge of the signal at the reference clock terminal.

12. A control loop filter, comprising:

an integration coefficient control circuit having a control output and first and second control inputs, wherein the first control input is coupled to an output voltage ramp active input, and a second control input is coupled to a slew rate input, the integration coefficient control circuit configured to provide an integration coefficient at the control output;

a shift left register having a shift left output and first and second shift left inputs, wherein the first shift left input is coupled to the control output, and the second shift left input is coupled to a phase frequency detection (PFD) output, the shift left register configured to provide a multiplier at the shift left output;

an integrator having an integrator input and an integrator output, the integrator input coupled to the shift left output; and a shift right register having a shift right output and a shift right input, wherein the shift right input is coupled to the integrator output, and the shift right register is configured to provide a high-side length signal at the shift right output.

13. The control loop filter of claim 12, wherein the shift left register is configured to shift left a signal at the second shift left input by a number of bits responsive to the integration coefficient.

14. The control loop filter of claim 12, wherein the shift right register is configured to shift right a signal at the integrator output and provide the high-side length signal.

15. A method of controlling a DC-DC converter, comprising:

receiving a reference clock input and a high-side active output, and in response providing a phase frequency detection (PFD) output;

filtering the PFD output, wherein the filter includes a controller configured to select an integration coefficient responsive to a slew rate of a scaled output voltage, and wherein a gain and a bandwidth of the filter are adjusted responsive to the integration coefficient;

providing a high-side length output in response to the PFD output and a slew rate input;

providing a fine pulse output in response to the high-side active output, the high-side length output and a fine select output; and providing the high-side active output in response to a comparison output and the fine pulse output.

16. The method of claim 15, further comprising:

providing an UP output and a DN output in response to the reference clock input and the high-side active output; and providing the fine select output and the PFD output in response to the UP output and the DN output.

17. The method of claim 15, further comprising:

providing a coarse pulse output in response to the high-side length output and the high-side active output; and providing the fine pulse output in response to the coarse pulse output and the fine select output.

18. The method of claim 15, further comprising:

providing the UP output responsive to a rising edge of the reference clock input occurring before a rising edge of the high-side active output; and providing the DN output responsive to the rising edge of the high-side active output occurring occurs before the rising edge of the reference clock input.

19. The method of claim 15, further comprising providing a high-side gate output signal and a low-side gate output signal in response to the high-side active output.

* * * * *